United States Patent [19]

Aulich et al.

[11] Patent Number: 4,497,675
[45] Date of Patent: Feb. 5, 1985

[54] PROCESS FOR THE MANUFACTURE OF SUBSTRATES FROM CARBON-COATED SILICON DIOXIDE FABRIC THAT CAN BE USED FOR LARGE-SURFACE SILICON BODIES

[75] Inventors: Hubert Aulich, Munich; Karl-Heinz Eisenrith, Schliersee; Hans-Peter Urbach, Munich, all of Fed. Rep. of Germany

[73] Assignee: Siemens Aktiengesellschaft, Berlin and Munich, Fed. Rep. of Germany

[21] Appl. No.: 555,099

[22] Filed: Nov. 25, 1983

[30] Foreign Application Priority Data

Dec. 22, 1982 [DE] Fed. Rep. of Germany ....... 3247532

[51] Int. Cl.³ .................. H01L 21/225; C03C 25/02; C03C 25/06
[52] U.S. Cl. ........................... 148/191; 65/3.1; 65/3.11; 65/3.15; 65/31; 29/572; 148/1.5; 204/192 C; 136/258; 136/261; 427/74; 427/86; 427/309; 427/434.2
[58] Field of Search .................. 156/663; 65/3.1, 3.11, 65/3.12, 3.15, 31; 29/572; 148/1.5, 191; 204/192 C; 427/74, 86, 122, 309, 434.2; 136/258 PC, 261

[56] References Cited

U.S. PATENT DOCUMENTS

| | | | |
|---|---|---|---|
| 3,356,563 | 12/1967 | Marzocchi | 428/371 |
| 3,914,856 | 10/1975 | Fang | 29/572 |
| 4,152,535 | 5/1979 | Deminet et al. | 136/258 PC |
| 4,171,991 | 10/1979 | Lindmayer | 148/1.5 |
| 4,370,288 | 1/1983 | Rice, Jr. et al. | 264/81 |

FOREIGN PATENT DOCUMENTS 3010557 9/1981 Fed. Rep. of Germany.

Primary Examiner—Aaron Weisstuch
Attorney, Agent, or Firm—Karl F. Milde, Jr.

[57] ABSTRACT

The invention concerns a process for the manufacture of substrates from carbon-coated $SiO_2$ fabric that can be used for large-surface silicon bodies, in which mineral materials or waste containing $SiO_2$ are used as starting materials and a mixture of $Al_2O_3$ and oxides of the alkaline and/or alkaline earth metals is used as a flux for the transformation into the glass phase. The glass fibers made from the homogenous glass melt are processed into a glass fabric, which is then subjected to an acid leaching process and coated with carbon. The process is used for the low-cost production of substrates for silicon bodies that are manufactured according to the strip-coating process for use in solar cells.

20 Claims, 1 Drawing Figure

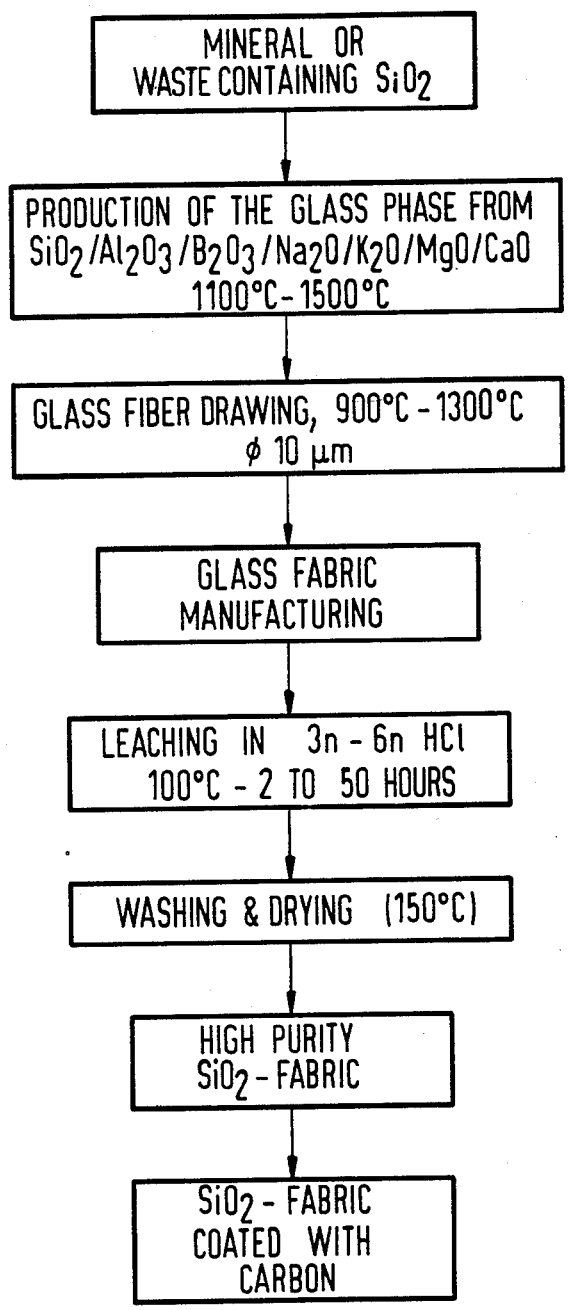

PROCESS FOR THE MANUFACTURE OF SUBSTRATES FROM CARBON-COATED SILICON DIOXIDE FABRIC THAT CAN BE USED FOR LARGE-SURFACE SILICON BODIES

BACKGROUND OF THE INVENTION

The invention relates to a process for the manufacture of substrates from carbon-coated silicon dioxide fabrics that can be used for large-surface silicon bodies, such as those used for the production of solar cells according to a strip-coating process.

The use of monocrystalline silicon for the construction of solar cells is the determinative factor in calculating the overall manufacturing costs for the solar cells. Polycrystalline silicon is well-suited for the manufacture of solar cells with a satisfactory degree of efficiency (10% and up) and significantly lower costs.

U.S. Pat. No. 4,171,991 discloses a process for the strip drawing of silicon bodies for solar cells. In this process a graphite cloth strip containing perforations is dipped into a silicon melt and coated with silicon by a continuous drawing process. This process requires substantial quantities of silicon melt and the use of expensive graphite strips.

Published German Patent Application DE-OS No. 3,010,557 discloses a strip-coating process for silicon, in which a carrier body consisting of graphite threads with a net-like structure is used. The coating is conducted, with reference to the drawing speed, so that as a result of the high surface tension of the molten silicon, only a thin silicon layer is formed in the meshes of the net. Then, after hardening, the network consisting of the graphite threads is integrated into the silicon body. This process is more cost-efficient than the process described in U.S. Pat. No. 4,171,991, because only minimal quantities of silicon are consumed. In place of the graphite threads, it is possible to use graphitized silica glass fibers for the net-like structure used in published German Patent Application DE-OS No. 30 10 557. This is advantageous because these fibers are substantially cheaper than the graphite threads.

The substrate for the coating must be a material that neither reacts with the molten silicon, nor forms a eutectic mixture with it. Furthermore, the substrate for the coating should not soften at high temperatures, so that the shape of the substrate remains unaltered despite changes in temperature.

These requirements are met by $SiO_2$ in a highly pure form. The use of high-purity $SiO_2$ for the manufacture of sheet silicon requires $SiO_2$ in the form of high-purity $SiO_2$ fibers and fabrics. Both of these forms of $SiO_2$ are commercially available, but there is no way to use them economically, because of their excessively high price.

SUMMARY OF THE INVENTION

The object of the invention is to provide a process for the manufacture of silica glass threads for further processing as substrates for solar cells, in which cheap starting materials are used and which affords the possibility of producing $SiO_2$ in a high-purity form and in an economical manner.

In general, the invention features a process for the manufacture from carbon-coated silicon dioxide fabric of substrates that can be used as large-surface silicon bodies, for the manufacture of solar cells according to a strip-coating process, including the steps of:

(a) using mineral or waste materials containing $SiO_2$ as starting materials;
(b) transforming the starting materials into a glass phase with a mixture of materials selected from the group consisting of aluminum oxide ($Al_2O_3$), carbonates and oxides of the elements in the alkaline and alkaline earth metal groups;
(c) producing a homogenous glass melt at 1100° to 1500° C.;
(d) transforming the glass melt into a glass fiber stage;
(e) processing the glass fiber into a glass fabric;
(f) subjecting the glass fabric to a leaching process in hot mineral acid; and
(g) coating the glass fabric with carbon.

The use of the following starting materials is included within the scope of the invention: silica sand obtained by mining ($SiO_2$), or volcanic rocks such as feldspar ($K.AlSi_3O_8$, $Na.AlSi_3O_8$), basalt or olivines (silicates with beryllium, magnesium, zinc, iron, manganese), or mixtures of the above; and as flux stones, in addition to aluminum oxide ($Al_2O_3$), the oxides or carbonates of sodium, potassium, magnesium and calcium or, as flux stones, minerals, such as dolomite ($CaCO_3$, $MgCO_3$), that contain sodium, potassium, calcium and/or magnesium in the oxide state.

A refinement of the invention provides that waste products such as quartz and/or glass shards may also be used, in the desired proportions, as starting materials. The process according to the invention is novel because cheap starting materials can be used.

Glass with the following composition is preferred for the process of the invention:

$SiO_2$: 50 to 70% by weight
$Na_2O$: 0 to 10% by weight
$K_2O$: 0 to 10% by weight
$MgO$: 0 to 10% by weight
$CaO$: 0 to 20% by weight
$Al_2O_3$: 0 to 20% by weight
$B_2O_3$: 0 to 10% by weight
$P_2O_5$: 0 to 10% by weight The transformation into the glass fiber structure can be accomplished by means of a multi-nozzle crucible, through which the glass fibers are drawn perpendicularly downward. When using this method, it is preferable to set the diameter of the glass fibers at about 10 microns. The leaching process may take place, for example, in 3 n to 6 n hydrochloric acid heated to 100° C., preferably in an extractor. According to the composition of the glass in each case, a treatment with weak caustic sode solution can be conducted after the acid process, followed by another acid treatment.

Other features and advantages of the present invention will become apparent from the following detailed description, and from the claims.

For a full understanding of the present invention, reference should now be made to the following detailed description and to the accompanying drawing.

BRIEF DESCRIPTION OF THE DRAWINGS

The single FIGURE shows diagrammatically the essential steps of the process.

DETAILED DESCRIPTION

The invention will now be described in detail with reference to the single FIGURE and the following example.

The starting materials, such as silica sand obtained by mining, aluminum oxide, boron oxide, sodium carbonate, potassium carbonate, dolomite ($CaCO_3$, $MgCO_3$) or basalt, are melted in the desired proportions, at 1100° to 1500° C., to a homogeneous glass and refined. It is also possible to add waste products such as glass shards to the starting materials in the desired proportion. At a temperature of 900° to 1300° C., glass fibers with a diameter of about 10 microns are drawn perpendicularly downward from the glass melt through a multi-nozzle crucible. The processing of the glass fibers into a glass fabric is followed by several stages of a leaching process, in which the glass fabric is preferably treated with 3 n to 6 n hydrochloric acid heated to 100° C. During this process the glass-forming metal oxides as well as the oxide impurities are extracted, and a high-purity $SiO_2$ fabric remains. The content of transition-metal ions is less than 1 ppm; when glass containing boron is used the boron content is less than 100 ppm. Before it is coated with silicon, the high-purity $SiO_2$ fabric must first be coated with carbon, for example by means of cathode sputtering, to ensure that the $SiO_2$ is wetted with silicon.

The invention also includes the possibility of choosing the composition of the glass so that after the leaching process a specified amount of boron or phosphorous remains in the $SiO_2$ network. When the fabric is coated with molten silicon, these doping agents can diffuse out of the substrate into the silicon and act as a primary doping (p- or n-conductive) or as a $p^+$ or $n^+$ layer on the rear side of the cell to produce a back surface field.

There has been shown and described a novel process for the manufacture of substrates that can be used for large-surface silicon bodies, which fulfills all the objects and advantages sought. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A process for the manufacture of substrates from carbon-coated silicon dioxide fabric that can be used for large-surface silicon bodies, for the manufacture of solar cells according to a strip-coating process, the improvement comprising the steps of:
   (a) using mineral or waste materials containg $SiO_2$ as starting materials;
   (b) transforming said starting materials into a glass phase with a mixture of materials selected from the group consisting of aluminum oxide ($Al_2O_3$), carbonates, and oxides of the elements in the alkaline and alkaline earth metal groups;
   (c) producing a homogenous glass melt at 1100° to 1500° C.;
   (d) transforming said glass melt into a glass fiber stage;
   (e) processing said glass fiber into a glass fabric;
   (f) subjecting said glass fabric to a leaching process in hot mineral acid; and
   (g) coating said glass fabric with carbon.

2. The process according to claim 1, wherein 3 n–6 n hydrochloric acid heated to 100° C. in an extractor is used as said hot mineral acid.

3. The process according to claim 1, further comprising adding boron oxide ($B_2O_3$) to said mixture of materials selected from the group consisting of aluminum oxide, carbonates, and oxides of the elements in the alkaline and alkaline earth metal groups.

4. The process according to claim 1, wherein said mineral starting materials comprise materials selected from the group consisting of silica sand obtained by mining, volcanic rocks, basalt, and olivines (silicates with beryllium, magnesium, zinc, iron, and manganese).

5. The process according to claim 4, wherein said volcanic rocks are feldspar ($K.AlSi_3O_8$, $Na.AlSi_3O_8$).

6. The process according to claim 1, wherein said mineral starting material comprises quartz waste and glass waste.

7. The process according to claim 6, wherein said glass waste comprises glass shards.

8. The process according to claim 1, further comprising the addition of oxides of sodium, potassium, magnesium, and calcium for the transformation of said starting materials into said glass phase.

9. The process according to claim 8, wherein the content of $Al_2O_3$ and $CaO$ in said glass melt does not exceed 20% by weight and the content of alkaline and alkaline earth metal oxides does not exceed 10% by weight.

10. The process according to claim 1, further comprising the addition of carbonates of sodium, potassium, magnesium, and calcium for the transformation of said starting materials into said glass phase.

11. The process according to claim 1, wherein dolomite ($CaCO_3$, $MgCO_3$) which contains potassium, calcium, and magnesium in the oxide form, is used for transforming said starting materials into said glass phase.

12. The process according to claim 1, wherein the step of transforming said glass melt into a glass fiber stage is accomplished with a multi-nozzle crucible, through which said glass fibers are drawn perpendicularly downward.

13. The process of claim 12, wherein said glass fibers have a diameter substantially equal to 10 microns.

14. The process according to claim 1, wherein the step of subjecting said glass fabric to hot mineral acid further comprises subsequent treating with a weak caustic soda solution.

15. The process according to claim 14, wherein the step of subjecting said glass fabric to hot mineral acid is repeated.

16. The process according to claim 1, wherein the step of coating said glass fabric with said carbon is accomplished with cathode sputtering.

17. The process according to claim 1, wherein a composition of the glass is used so that following subjecting said glass fabric to a leaching process, a sufficient amount of boron remains in said silicon dioxide whereby, when subsequently coating said fabric with molten silicon, primary doping of said silicon body is accomplished by diffusion from said fabric.

18. The process according to claim 1, wherein a composition of the glass is used so that following subjecting said glass fabric to a leaching process, a sufficient amount of phosphorous remains in said silicon dioxide fabric whereby, when subsequently coating said fabric with molten silicon, primary doping of said silicon body is accomplished by diffusion from said fabric.

19. The process according to claim 1, wherein a composition of the glass is used so that, following subjecting said glass to a leaching process, a sufficient amount of boron remains in said silicon dioxide fabric, whereby when said fabric is coated with molten silicon, a p+ layer is formed in the silicon body by diffusion from the fabric so that said layer can be used as a back-surface contact for said solar cell.

20. The process according to claim 1, wherein a composition of the glass is used so that, following subjecting said glass to a leaching process, a sufficient amount of phosphorous remains in said silicon dioxide fabric, whereby when said fabric is coated with molten silicon, an n+ layer is formed in the silicon body by diffusion from the fabric so that said layer can be used as a back-surface contact for said solar cell.

* * * * *